(12) United States Patent
Jeong et al.

(10) Patent No.: US 11,700,745 B2
(45) Date of Patent: Jul. 11, 2023

(54) DISPLAY DEVICE AND METHOD FOR REPLACING PROTECTIVE FILM

(71) Applicant: LG DISPLAY CO., LTD., Seoul (KR)

(72) Inventors: Yeonjae Jeong, Paju-si (KR); Jungmin Lee, Seoul (KR); Hyesun Song, Paju-si (KR); Hyesun Son, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 211 days.

(21) Appl. No.: 17/128,809

(22) Filed: Dec. 21, 2020

(65) Prior Publication Data

US 2021/0202903 A1 Jul. 1, 2021

(30) Foreign Application Priority Data

Dec. 31, 2019 (KR) .................. 10-2019-0179827

(51) Int. Cl.
*H10K 50/844* (2023.01)
*H10K 71/00* (2023.01)

(52) U.S. Cl.
CPC .......... *H10K 50/844* (2023.02); *H10K 71/00* (2023.02)

(58) Field of Classification Search
CPC .... G06F 1/1626; G06F 1/1656; G06F 1/1652; G09F 9/301; G09F 9/33; G02F 1/1335; G02F 1/1303; H01L 51/56; H01L 51/5253; H01L 51/5237; H01L 2251/5338
See application file for complete search history.

(56) References Cited

U.S. PATENT DOCUMENTS

| | | | |
|---|---|---|---|
| 2010/0315575 A1* | 12/2010 | Chang | G02F 1/133308 349/122 |
| 2014/0293518 A1 | 10/2014 | Park et al. | |
| 2015/0123911 A1 | 5/2015 | Poliakov et al. | |
| 2015/0268490 A1* | 9/2015 | Yang | G02F 1/1333 428/121 |
| 2017/0069808 A1 | 3/2017 | Kim et al. | |
| 2017/0231121 A1* | 8/2017 | Morton | G02F 1/133308 |

(Continued)

FOREIGN PATENT DOCUMENTS

| | | |
|---|---|---|
| CN | 203643716 U | 6/2014 |
| CN | 104076547 A | 10/2014 |

(Continued)

OTHER PUBLICATIONS

Office Action dated Jul. 21, 2022, issued in corresponding Chinese Patent Application No. 202011537037.X.

*Primary Examiner* — Shaun M Campbell
(74) *Attorney, Agent, or Firm* — Morgan, Lewis & Bockius LLP

(57) ABSTRACT

A display device includes a display panel, a refraction index matching layer disposed on the display panel and including a non-adhesive material, a first protective film disposed on the refraction index matching layer, and a supporting unit including a horizontal portion, a side portion vertically bent from the horizontal portion, and a protrusion portion vertically bent from the side portion and disposed on the protective film. Further, the display panel, the refraction index matching layer, and the protective film are seated on the horizontal portion of the supporting unit. Therefore, the folding characteristic is excellent and the protective film may be easily replaced without causing the damage on the display panel if necessary.

16 Claims, 3 Drawing Sheets

(56) References Cited

U.S. PATENT DOCUMENTS

2021/0135151 A1\* 5/2021 Baek .................. H01L 51/5237
2021/0174052 A1\* 6/2021 Tan .................... G06V 40/1324

FOREIGN PATENT DOCUMENTS

| KR | 10-2006-0028283 A | 3/2006 |
| KR | 10-2007-0002193 A | 1/2007 |
| KR | 10-2011-0090265 A | 8/2011 |

\* cited by examiner

DISPLAY DEVICE AND METHOD FOR REPLACING PROTECTIVE FILM

CROSS-REFERENCE TO RELATED APPLICATIONS

This application claims the priority of Korean Patent Application No. 10-2019-0179827 filed on Dec. 31, 2019, in the Korean Intellectual Property Office, the disclosure of which is incorporated herein by reference.

BACKGROUND

Technical Field

The present disclosure relates to a display device and a method for replacing a protective film, and more particularly, to a display device and a method for replacing a protective film which have an excellent folding reliability and easily replace a protective film without causing a damage on a display panel if necessary.

Discussion of the Related Art

As it enters an information era, a display field which visually expresses electrical information signals has been rapidly developed, and in response to this, various display devices having excellent performances such as thin-thickness, light weight, and low power consumption have been developed. Specific examples of such a display device include a liquid crystal display device (LCD), a plasma display panel device (PDP), a field emission display device (FED), and an organic light emitting display device (OLED).

Recently, a shape or a size of the display device has gradually diversified and in particularly, an interest in a foldable display device which maintains a display performance even though the display device is folded is consistently increasing. Therefore, researches and developments of display devices having an excellent folding characteristic are actively being conducted.

In the meantime, in the above-described various display devices, a protective film is disposed above a display panel to protect the display panel and the protective film is fixed to an upper portion of the display panel by means of an adhesive member. In order to implement a foldable display device, a higher adhesiveness is required to suppress air bubbles generated between the protective film and the panel at the time of folding and suppress the protective film from being separated from the display panel.

SUMMARY

When an adhesive member having a higher adhesiveness is used to attach the protective film onto the display panel to ensure the folding characteristic, it is difficult to replace the protective film if necessary and a damage is caused on the display panel while replacing the protective film. Therefore, a method of attaching the protective film onto the display panel using a variable adhesive whose adhesiveness varies by heat or light has been proposed. However, in this case, a process of lowering the adhesiveness by applying heat or irradiating light before replacing the protective film is necessary. Further, in the case of a thermally variable adhesive, the adhesiveness is lowered by applying a high temperature heat. In this case, the panel is thermally deformed or damaged at the high temperature so that it is difficult to substantially apply the thermally variable adhesive. Further, the adhesiveness of a photo-variable adhesive needs to be lowered by light irradiated when the protective film is replaced, but the display device is exposed to natural light so that it is difficult to reduce the adhesiveness only when necessary.

That is, in order to easily replace the protective film, when an adhesive having a low adhesiveness is used, the folding reliability is not satisfied. On the contrary, when an adhesive having a high adhesiveness which satisfies the folding reliability is used, the display panel may be damaged during the process of replacing the protective film. Further, when a variable adhesive is used, an additional process of lowering the adhesiveness by applying heat or irradiating light is required and it is difficult to adjust the adhesiveness so that it is difficult to substantially apply the variable adhesive.

Accordingly, embodiments of the present disclosure are directed to a display device and a method for replacing a protective film that substantially obviate one or more of the problems due to limitations and disadvantages of the related art.

Accordingly, an object of the present disclosure is to provide a display device and a method for replacing a protective film which have an excellent folding reliability and easily replace a protective film with a simplified process without causing a damage on a display panel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device includes a display panel, a refraction index matching layer disposed on the display panel and including a non-adhesive material, a protective film disposed on the refraction index matching layer, and a supporting unit including a horizontal portion, a side portion vertically bent from the horizontal portion, and a protrusion portion vertically bent from the side portion and disposed on the protective film, and the display panel, the refraction index matching layer and the protective film are seated on the horizontal portion of the supporting unit.

In another aspect, a method for replacing a protective film comprises, in a display device including a display panel, a refraction index matching layer disposed on the display panel and including a non-adhesive material, a first protective film disposed on the refraction index matching layer, and a supporting unit including a horizontal portion, a side portion vertically bent from the horizontal portion, and a protrusion portion vertically bent from the side portion and disposed on the first protective film, a first step of opening one side surface of the supporting unit to expose at least one side surface of the first protective film, a second step of separating the first protective film from the refraction index matching layer, a third step of disposing a second protective film on the refraction index matching layer, and a fourth step of coupling the open one side surface of the supporting unit to cover a side surface and a top surface of the second protective film.

Other detailed matters of the exemplary embodiments are included in the detailed description and the drawings.

According to the exemplary embodiment of the present disclosure, a protective film is disposed on a non-adhesive refraction index matching layer so that the protective film may be easily replaced without causing the damage on the display panel if necessary. Specifically, a separate operation for lowering the adhesiveness is not necessary so that a process advantage can be achieved. Furthermore, the protective film is stably fixed onto the display panel by the supporting unit so that the folding characteristic is excellent, and a long-term reliability is excellent. Further, an additional effect of reducing the deterioration of the visibility due to a fine air gap between the protective film and the display panel is provided by applying a refraction index matching layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1A:
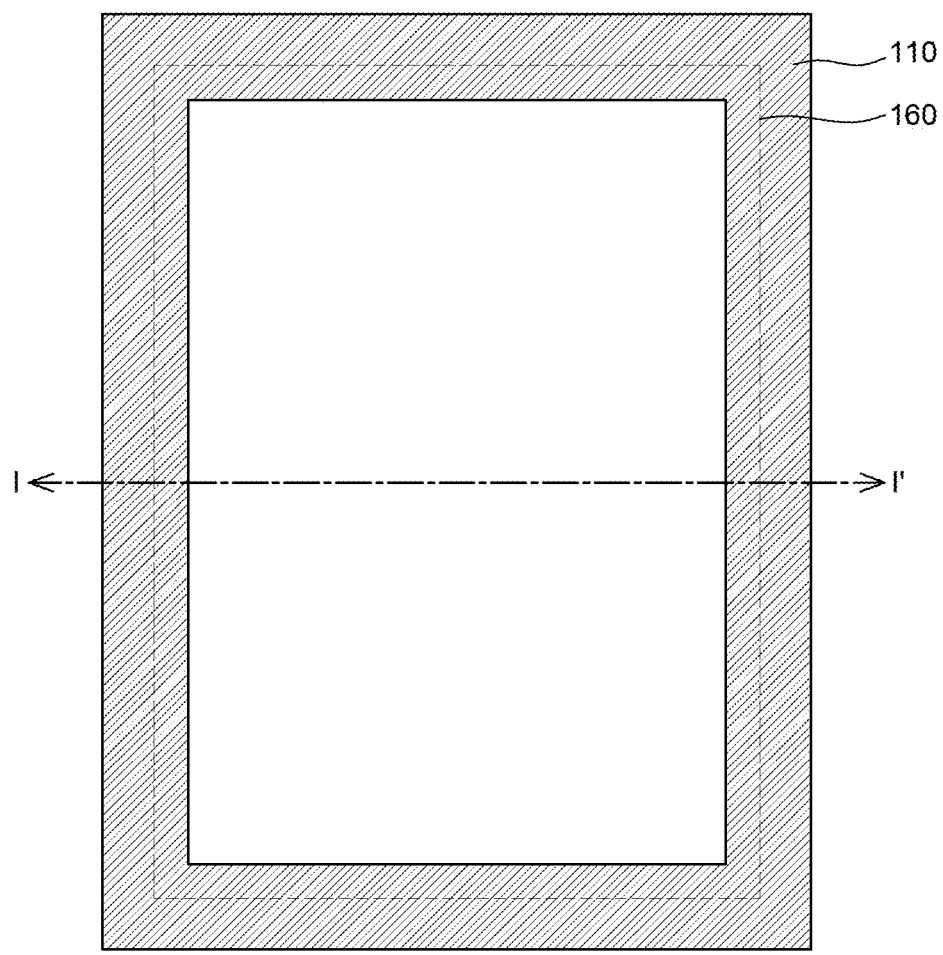
FIG. 1A is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Figure 1B:
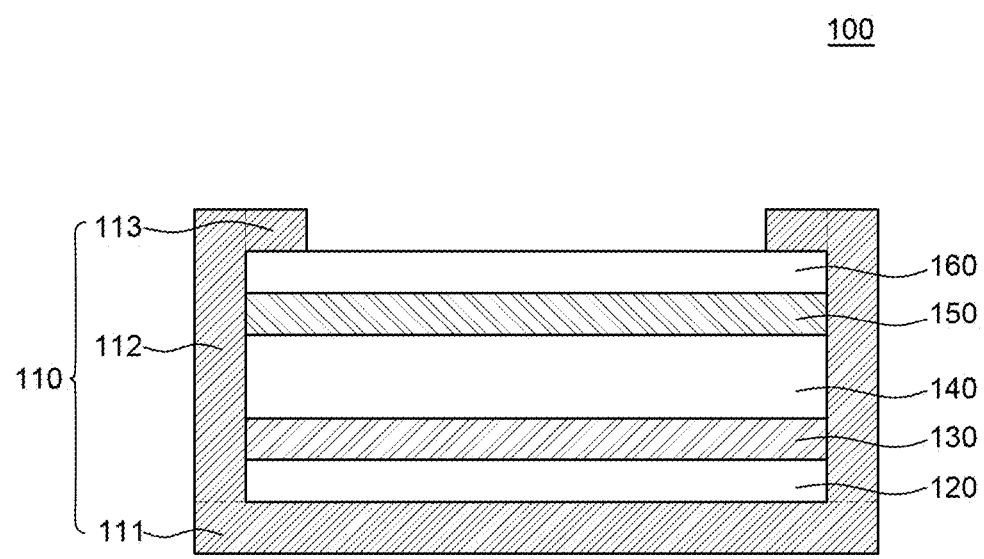
FIG. 1B is a cross-sectional view taken along I-I' of FIG. 1A.

FIG. 1A is a plan view of a display device according to an exemplary embodiment of the present disclosure. FIG. 1B is a cross-sectional view taken along I-I' of FIG. 1A. Even though in FIGS. 1A and 1B, it is illustrated that the display device of the present disclosure is an organic light emitting display device for the convenience of description, the display device of the present disclosure is not limited to the organic light emitting display device.

Referring to FIGS. 1A and 1B, an organic light emitting display device 100 according to an exemplary embodiment of the present disclosure includes a display panel 130, a cover member 140, a refraction index matching layer 150, a protective film 160, and a supporting unit 110.

The display panel 130 displays images. For example, the display panel 130 may be an organic light emitting display panel which includes an organic light emitting layer to display images using light emitted from the organic light emitting layer. The organic light emitting display panel includes a display area and a non-display area. The display area is an area where a plurality of pixels is disposed to substantially display images. In the display area, pixels including an emission area for displaying images and a driving circuit for driving the pixels may be disposed. The non-display area encloses the display area. The non-display area is an area where images are not substantially displayed and various wiring lines, driving ICs, and printed circuit boards for driving the pixels disposed in the display area and the driving circuits are disposed. For example, in the non-display area, various ICs such as a gate driver IC and a data driver IC may be disposed. In the meantime, as described above, in the non-display area, the driving IC and the printed circuit board may be disposed, and a predetermined area is necessary to dispose the driving IC and the printed circuit board.

The organic light emitting display panel includes a substrate, a thin film transistor, an anode, an organic light emitting stack, a cathode, and an encapsulation layer.

The substrate is a base member which supports various elements of the organic light emitting display panel and is formed of an insulating material. For example, the substrate may be a glass substrate or a plastic substrate. For example, the plastic substrate may be selected from polyimide, polyethersulfone, polyethylene terephthalate, and polycarbonate, but is not limited thereto.

The thin film transistor is disposed on the substrate. The thin film transistor includes a gate electrode, an active layer, a source electrode, and a drain electrode. For example, the active layer is disposed on the substrate, and a gate insulating layer is disposed on the active layer to insulate the active layer from the gate electrode. Further, an interlayer insulating layer which insulates the gate electrode from the source electrode and the drain electrode is disposed on the substrate. The source electrode and the drain electrode which are in contact with the active layer, respectively, are formed on the interlayer insulating layer. A planarization layer may be disposed on the thin film transistor. The planarization layer planarizes an upper portion of the thin film transistor. The planarization layer may include a contact hole which electrically connects the thin film transistor and the anode.

The anode is disposed on the planarization layer. The anode is a component which supplies holes to the organic light emitting layer and is formed of a conductive material having a high work function. The anode may be divided and formed for each of the sub pixels.

The cathode is disposed on the anode. The cathode may be formed of a metal material having a low work function to smoothly supply electrons to the organic light emitting layer. The cathode is formed on the anode as one layer without being patterned. That is, the cathode is not divided for every sub pixel area but is formed as a continuous single layer.

The organic light emitting stack is disposed between the anode and the cathode. The organic light emitting stack includes an organic light emitting layer. The organic light emitting layer is a layer in which electrons and holes are coupled to emit light. Further, the organic light emitting stack may include a hole injection layer, a hole transport layer, an electron transport layer, and an electron injection layer. For example, the organic light emitting stack may be configured by the hole injection layer disposed on the anode, the hole transport layer disposed on the hole injection layer, an organic light emitting layer disposed on the hole transport layer, the electron transport layer disposed on the organic light emitting layer, and the electron injection layer disposed on the electron transport layer.

The encapsulation layer is disposed on the cathode to minimize the deterioration of the display panel 130 due to moisture or oxygen. The encapsulation layer planarizes an upper surface of the display panel 130 and fills a space between the cathode and a component thereabove. The encapsulation layer may be formed with a multi-layered structure in which an inorganic layer formed of an inorganic insulating material and an organic layer formed of an organic material are laminated. For example, the encapsulation layer may be configured by at least one organic layer and at least two inorganic layers and have a multi-layered structure in which the inorganic layers and the organic layer are alternately laminated but is not limited thereto. For example, the encapsulation layer has a triple-layered structure including a first inorganic layer, an organic layer, and a second inorganic layer.

When a plastic substrate having flexibility is used as a substrate to implement a flexible characteristic and a foldable characteristic, the plastic substrate has a rigidity weaker than the glass substrate. Therefore, the plastic substrate may be sagged when various elements which configure the display panel 130 are disposed. Correspondingly, a back plate 120 may be disposed below the substrate.

The back plate 120 supports the substrate so as not to be sagged and protects the display panel 130 from the external environment such as moisture, heat, or impacts. The back plate 120 may have a flat plate shape and may be formed of a metal or plastic material having not only an excellent durability, but also a flexibility to protect the display panel 130. For example, the back plate 120 may be a metal material such as stainless steel (SUS) or a plastic material such as polymethylmethacrylate, polycarbonate, polyvinyl alcohol, acrylonitrile-butadiene-styrene, or polyethylene terephthalate.

The back plate 120 may be adhered to a lower portion of the substrate by an adhesive member. The adhesive member may be a photo transparent adhesive or a pressure-sensitive adhesive but is not limited thereto.

The touch sensor may be disposed on the encapsulation layer to impart a touch sensing function to the organic light emitting display device 100. For example, the touch sensor may be adhered onto the encapsulation layer by an adhesive or may be directly formed on the encapsulation layer without using an adhesive. As another example, the touch sensor may be disposed in the display panel 130. However, the arrangement of the touch sensor is not specifically limited but may be selectively changed as needed.

The cover member 140 is disposed above the display panel 130. The cover member 140 protects the display panel 130 from the external impact or scratches. The cover member 140 may be formed of a material having excellent scratch resistance, impact resistance, and light transmittance and flexibility. For example, the cover member 140 may be glass or transparent plastic. For example, the transparent plastic may be selected from polymethyl methacrylate (PMMA), polycarbonate (PC), cycloolefin polymer, polyethylene terephthalate (PET), or polyimide (PI), but is not limited thereto. The cover member 140 may be adhered onto the display panel 130 by means of the adhesive member. The adhesive member may be a photo transparent adhesive or a pressure-sensitive adhesive but is not limited thereto.

The refraction index matching layer 150 is disposed on the cover member 140. The refraction index matching layer 150 minimizes the deterioration of the visibility due to a fine air gap between the cover member 140 and the protective film 160. In the display device 100 according to the exemplary embodiment of the present disclosure, in order to easily replace the protective film 160 without causing a damage of the display panel 130 if necessary, the protective film 160 is fixed onto the display panel 130 by the supporting unit 110 without providing the adhesive member below the protective film 160. In this case, a fine air gap may be generated on the protective film 160 and the cover member 140 which is a component disposed below the protective film. A refraction index of the fine air gap is significant difference from the refraction index of the cover member 140 and the protective film 160, and may cause deteriorate the visibility of the display device 100. The refraction index matching layer 150 minimizes the formation of the fine air gap and reduces the difference in refraction index to minimize the deterioration of the visibility.

For example, a refraction index of the refraction index matching layer 150 may be 1.3 to 1.7 or 1.4 to 1.6. The refraction index of the cover member 140 and the refraction index of the refraction index matching layer 150 are similar in this range so that the display device 100 has an excellent visibility. For example, when glass is used for the cover member 140, a refraction index of glass is 1.4 to 1.55 so that the refraction index matching layer 150 may be formed of a material having a similar refraction index but is not limited thereto. As another example, when a transparent plastic film is used for the cover member 140, a refraction index of the transparent plastic which is available for the cover member 140 is 1.3 to 1.7 so that the refraction index matching layer 150 may be formed of a material having a similar refraction index but is not limited thereto. For example, a difference between the refraction index of the refraction index matching layer and the refraction index of the cover member 140 may be 0.3 or lower, 0.15 to 0.30, or 0.20 to 0.25. In this case, the display device 100 may have more excellent visibility.

For example, the refraction index may be measured using a refraction index meter with a wavelength of 589.3 nm at a temperature of 25° C.

A water contact angle of the refraction index matching layer 150 may be 130° or lower or 100° or lower. When the water contact angle of the refraction index matching layer 150 exceeds 130°, the interaction between the cover member 140 and the protective film 160 and the refraction index matching layer 150 is deteriorated to cause an air gap. Further, the refraction index difference is increased so that the visibility may be deteriorated.

For example, the water contact angle may be measured using a contact angle meter by dropping distilled water at 25° C.

A thickness of the refraction index matching layer 150 may be 10 μm or larger or 10 μm to 300 μm. When the thickness of the refraction index matching layer 150 is 10 μm or larger, the refraction index matching layer may serve to buffer against the external impact and have an enough slip property to easily replace the protective film 160. When the thickness of the refraction index matching layer 150 is 300 μm or larger, the folding characteristic may be deteriorated, and it may be difficult to manufacture a foldable display device with a larger curvature. However, the thickness of the refraction index matching layer 150 is not limited thereto and may vary depending on a material which configures the refraction index matching layer 150 or a structure or a design of the display device. For example, the thickness of the refraction index matching layer 150 may vary depending on shapes of various display devices such as a foldable display device, a multi-foldable display device, or a rollable display device or also vary depending on a curvature (R value) of the display device.

The refraction index matching layer 150 may be a non-adhesive coating layer formed of a non-adhesive material. As the refraction index matching layer 150 is formed of a non-adhesive material, the protective film 160 may be easily replaced, if necessary, without causing a damage on the display panel 130. Further, an operation for lowering the adhesiveness to separate the protective film 160 from the cover member 140 is not necessary so that a process advantage may be achieved. In this case, when the adhesiveness of the refraction index matching layer 150 is 10 gf/in or lower, the refraction index matching layer is determined to be non-adhesive. In this case, the protective film 160 may be easily separated from the cover member 140 and an operation for lowering the adhesiveness is not necessary so that a process advantage may be achieved.

For example, the adhesiveness may be determined by measuring a peeling strength by separating the tape at 180° after bonding a tape onto a surface of the refraction index matching layer.

For example, a loss modulus G" of the refraction index matching layer 150 may be larger than a storage modulus G' at a room temperature. The storage modulus G' refers to an energy which is stored again by the elasticity when energy is applied to a material and the loss modulus G" refers to an energy which is lost due to a viscous property. When the loss modulus G" is large at the room temperature, it means that the viscous property is relatively predominant rather than elasticity. A material which satisfies the above-described condition has a liquid or oily property at the room temperature. Accordingly, the protective film 160 disposed on the refraction index matching layer 150 may be easily replaced without causing the damage on the display panel 130 or remaining a residue of the protective film 160.

As another example, when the adhesiveness is 10 gf/in or lower to have a non-adhesive property and the refraction index is in the range of 1.3 to 1.7, a material in which the loss modulus G" is smaller than the storage modulus G' at the room temperature may also be used as the refraction index matching layer 150.

The refraction index matching layer 150 may preferably have a low storage modulus within a temperature range which requires a folding reliability to satisfy the folding characteristic. For example, in the temperature range of −20° C. to 100° C., the storage modulus of the refraction index matching layer 150 may be $10^5$ Pa or lower. In this case, the protective film 160 may be easily separated while having an excellent folding characteristic.

Further, in the wide temperature range of −20° C. to 100° C., a loss tangent of the refraction index matching layer 150 may be 1 or larger. In this case, the loss tangent is a ratio (G"/G') of a loss modulus G" to the storage modulus G' and is also referred to as a tangent delta. When the loss tangent is 1 or larger, the loss modulus is larger than the storage modulus so that the refraction index matching layer has a fluidity. Therefore, the folding characteristic may be easily satisfied.

For example, the storage modulus, the loss modulus, and the loss tangent may be measured using a rheometer under the condition that a frequency is 0.1 Hz to 10 Hz.

In order to implement the foldable display device, the refraction index matching layer 150 needs to flexible in a broad temperature range. For example, a glass transition temperature of the refraction index matching layer 150 may be −30° C. or lower or −80° C. to −30° C. In this range, the device may be easily foldable and have an excellent folding reliability.

For example, the glass transition temperature may be measured by a differential scanning calorimeter (DSC) or as described above, the loss tangent is measured and a temperature which has the highest loss tangent is determined as the glass transition temperature.

The refraction index matching layer 150 may be formed of an oily or liquid compound which satisfies the above-mentioned physical property. For example, the refraction index matching layer 150 includes one or more selected from liquid silicone compounds, liquid acrylic compounds, mineral oils, paraffin oils, naphthenic oils, aromatic oils, process oils, liquid polyalkylene glycols, aliphatic hydrocarbons, alicyclic hydrocarbons, and liquid polybutene but is not limited thereto. For example, the liquid silicone compound may be selected from silicone oil, dimethyl silicone oil, methyl phenyl silicone oil, methyl hydrogen oil, silicone-polyester copolymer, and methyl chlorophenyl silicone oil but is not limited thereto. Further, the refraction index matching layer 150 may use commercially available refraction index matching liquid/oil or a lubricant which satisfies the mentioned physical properties. For example, the refraction index matching layer 150 may be formed using a matching liquid, an immersion oil, a refraction index matching liquid, or the like of Cargille Laboratories.

The above-described materials for forming the refraction index matching layer 150 may be applied on the cover member 140 to form a coating layer or dried to form a thin film depending on the materials.

The viscosity of the refraction index matching layer 150 may vary depending on the structure of the display device 100, a frequency with which the user folds the display device, a bending degree by the folding, or the like. For example, when a foldable display device has a folding frequency which means the number of folding the display device for a unit time which is 0.25 Hz or more, that is, the folding display device is folded once or more every 4 seconds, the refraction index matching layer 150 may be formed of a compound having a viscosity of 10000 cPs or lower (25° C.), but is not limited thereto.

Further, the refraction index matching layer 150 may preferably be formed of a colorless transparent material so as not to deteriorate the display quality of the display device 100.

For example, a surface tension of the refraction index matching layer 150 may be 18 dynes/cm to 34 dynes/cm or 20 dynes/cm to 30 dynes/cm. In this case, the non-adhesive property of the refraction index matching layer 150 is high so that the protective film 160 may be easily replaced without causing a damage on the display panel 130.

For example, the surface tension may be measured using a contact angle meter by dropping distilled water at 25° C.

The protective film 160 is disposed on the refraction index matching layer 150. The protective film 160 protects the display device 100 from the external environment. For example, the protective film 160 may include one or more selected from polyethylene terephthalate, polyimide, and polymethyl methacrylate, but is not limited thereto.

For example, the thickness of the protective film 160 may be 10 μm to 200 μm but is not limited thereto and appropriately selected if necessary.

When the protective film is bonded onto the cover member using a material having a high adhesiveness, it is not easy to remove the protective film if necessary and the display panel is damaged during the process of replacing the protective film. In the display device according to the exemplary embodiment of the present disclosure, the protective film 160 is disposed on the cover member 140 by means of the refraction index matching layer 150 and if necessary, the protective film 160 is easily replaced without remaining a residue on the cover member 140 and causing the damage on the display panel 130.

The supporting unit 110 is a case member which accommodates and protects the components of the display device 100. That is, the supporting unit 110 provides an accommodation unit which seats and fixes the back plate 120, the display panel 130, the cover member 140, the refraction index matching layer 150, and the protective film 160. Further, the supporting unit 110 fixes the protective film 160 onto the display panel 130. In the display device 100 according to the exemplary embodiment of the present disclosure, the protective film 160 is disposed on the refraction index matching layer 150 which is non-adhesive to easily replace the protective film 160 if necessary and the protective film 160 is fixed onto the display panel 130 using the supporting unit 110.

The supporting unit 110 may be formed of one of materials having flexibility. By doing this, a foldable display device 100 may be implemented. For example, the supporting unit 110 may be formed of one material selected from silicone resin, urethane resin, stainless steel (SUS), polymethyl methacrylate, polycarbonate, acrylonitrile-butadiene-styrene, polyethylene terephthalate, and the like.

The supporting unit 110 is formed to enclose a side surface and a bottom of the back plate 120, side surfaces of the display panel 130, the cover member 140, and the refraction index matching layer 150, and a side surface and a top surface of the protective film 160. The supporting unit 110 includes a horizontal portion 111, a side portion 112, and a protrusion portion 113.

The horizontal portion 111 supports the display device 100 from the bottom. That is, the back plate 120, the display panel 130, the cover member 140, the refraction index matching layer 150, and the protective film 160 are sequentially seated on the horizontal portion 111 of the supporting unit 110.

The side portion 112 is disposed to be perpendicular to the horizontal portion 111. The side portion 112 is formed to be vertically bent from four corners of the horizontal portion 111. By doing this, the supporting unit 110 has a rectangular frame shape. That is, the back plate 120, the display panel 130, the cover member 140, the refraction index matching layer 150, and the protective film 160 are seated and integrated as a module in an inner space of the supporting unit 110 having a rectangular frame. The respective side surfaces of the back plate 120, the display panel 130, the cover member 140, the refraction index matching layer 150, and the protective film 160 which are seated on the horizontal portion 111 are in contact with the inner side surface of the side portion 112. In this case, even though the display device 100 is bent or curved, elements of the display device 100 may maintain a shape without being deviated.

The side portion 112 vertically bent from any one or two corners of four corners of the horizontal portion 111 is designed to be detachable. By doing this, the protective film 160 may be easily replaced after detaching some side portions 112, which will be described below with reference to FIG. 2. As another example, the side portion 112 is bent from the horizontal portion 111 so as not to be continuously formed, but to be formed as independent components to be fastened by various fastening members.

The protrusion portion 113 is disposed to be perpendicular to the side portion 112. The protrusion portion 113 is vertically bent to the inside of the accommodation unit from an end of the side portion 112 which is not adjacent to the horizontal portion 111. That is, the protrusion portion is disposed so as to be opposite to the horizontal portion. The protrusion portion 113 is formed to enclose an edge area of the protective film 160. That is, the protrusion portion 113 has a frame shape. Therefore, a bottom surface of the protrusion portion 113 is in contact with the protective film 160. As the protrusion portion 113 is disposed to be in contact with a top surface of the protective film 160, the protective film 160 may be fixed without using an adhesive member. That is, the protective film 160 disposed on the non-adhesive refraction index matching layer 150 may be stably fixed onto the display panel 130 by the protrusion portion 113. Moreover, even though the display device 100 is bent or curved, the protective film 160 is fixed by the protrusion portion 113 to maintain a folding shape without being deviated.

In the display device according to the exemplary embodiment of the present disclosure, when the protective film is disposed on the cover member, a non-adhesive refraction index matching layer is disposed therebetween without using an adhesive member and the protective film is fixed onto the display panel using the supporting unit. By doing this, if necessary, the protective film may be easily replaced without causing a damage on the display panel and the non-adhesive refraction index matching layer is disposed below the protective film so that an operation of lowering the adhesiveness to separate the protective film is not necessary. Therefore, a process advantage is achieved. Further, the protective film is stably fixed onto the display panel by the supporting unit having the protrusion portion without using the adhesive member so that an excellent folding characteristic and folding reliability may be achieved. Further, the fine air gap is reduced by the refraction index matching layer so that the deterioration of the visibility of the display device may be suppressed.

Hereinafter, a method for replacing a protective film in a display device according to an exemplary embodiment of the present disclosure will be described with reference to FIGS. 2A to 2F together.

FIGS. 2A to 2F are views for explaining a method for replacing a protective film according to an exemplary embodiment of the present disclosure. Display devices 100a and 100b illustrated in FIGS. 2A to 2F are the same as the display device 100 illustrated in FIG. 1B except that a connection unit 114 is further provided to open a side portion of the supporting unit 110. Therefore, when the method for replacing the protective film is described, a redundant description will be omitted. In FIGS. 2A to 2F, a protective film before being replaced is illustrated as a first protective film 160a and a protective film after being replaced is illustrated as a second protective film 160b for the convenience of description.

A first step is a step of opening one side surface of the supporting unit 110 to separate the first protective film 160a which is integrated with the display panel from the display panel 130 by the supporting unit 110.

Figure 2A:
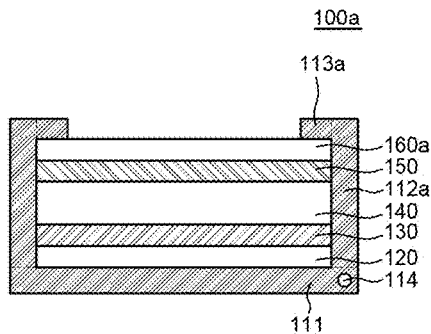
FIGS. 2A to 2F are views for explaining a method for replacing a protective film according to an exemplary embodiment of the present disclosure.
Figure 2B:
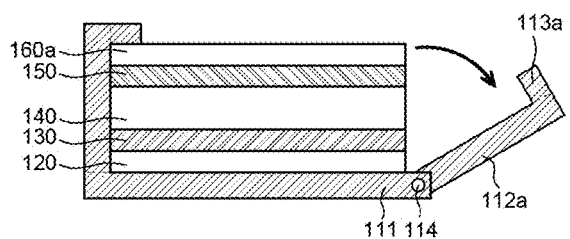

Referring to FIGS. 2A and 2B, one side surface of the supporting unit 110 may be open so as to expose at least one side surface of the first protective film 160a. For example, the supporting unit 110 includes a connection unit 114 at a portion where the horizontal portion 111 is in contact with a right side portion 112a to allow the right side portion 112a to be open. For example, if any component fixes a second protective film 160b which is replaced by opening the side surface of the supporting unit 110 to replace the first protective film and then being coupled again, the connection unit 114 is not specifically limited.

Figure 2C:
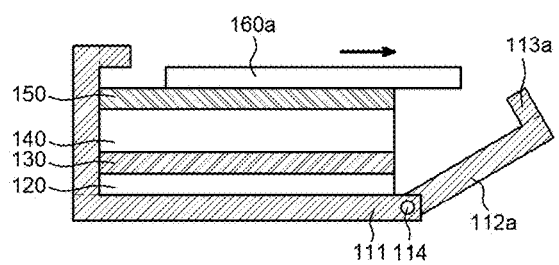

A second step is a step of separating the first protective film 160a from the display panel 130. For example, the first protective film 160a is separated from the display panel 130 in a sliding manner. Referring to FIG. 2C, in the second step, the first protective film 160a is separated from the display panel 130 by being slid to the outside of the display device 100a. The refraction index matching layer 150 disposed below the first protective film 160a includes a non-adhesive material so that it has a slipping property. Therefore, the first protective film 160a may be slid to be easily separated from the display panel 130. Further, the refraction index matching layer 150 is formed of a non-adhesive material so that the first protective film 160a may be easily separated without causing a damage on the display panel 130 or remaining a residue of the first protective film 160a on the display panel 130.

In the related art, the protective film is attached using a variable adhesive so that when it is necessary to replace the protective film, an operation of applying heat or irradiating light to reduce the adhesiveness of the variable adhesive is necessary so that the process is complex. Further, when a thermally variable adhesive is used, the adhesiveness of the adhesive is lowered due to high temperature heat and the display panel is deteriorated due to the high temperature heat.

However, in the display device 100a according to the exemplary embodiment of the present disclosure, the first protective film 160a is disposed on the non-adhesive refraction index matching layer 150 so that the right side portion 112a of the supporting unit 110 is open and then the first protective film 160a is slid. Therefore, the first protective film 160a may be easily separated from the display panel 130. However, a separating method of the first protective film 160a is not limited to the sliding method, but various methods may be used to separate the first protective film 160a without specifically being limited if the method does not cause the damage of the display panel 130.

Figure 2D:
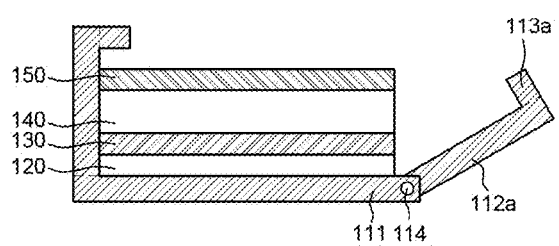

As illustrated in FIG. 2D, after completely separating the first protective film 160a, before replacing the second protective film 160b, if necessary, a step of coating a refraction index matching material on the display panel 130 may be selectively included.

That is, after separating the first protective film 160a, a refraction index matching material is coated on the remaining refraction index matching layer 150. The refraction index matching layer 150 may be a coating layer which is formed by applying oil or liquid material. In this case, during the process of replacing the first protective film 160a, a thickness of the refraction index matching layer 150 may be reduced. Accordingly, in order to adjust the thickness, an oil or liquid refraction index matching material may be additionally applied.

As another example, in a step of coating the refraction index matching material, an existing refraction index matching layer 150 is separated from the display panel 130 or removed by the cleaning and the refraction index matching material is coated on the display panel 130 to newly form a refraction index matching layer. For example, if the refraction index matching layer 150 is a thin film type, when the protective film 160a is removed or after removing the protective film 160a, a thin film type refraction index matching layer 150 may also be separated from the display panel 130. Further, prior to a third step, the refraction index matching material is coated to newly form a refraction index matching layer.

Figure 2E:
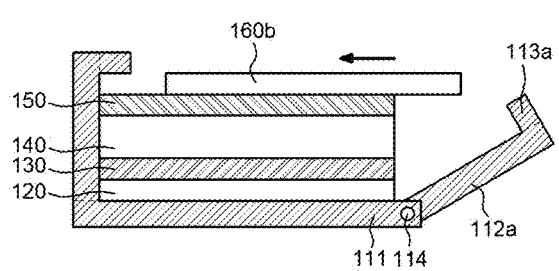

The third step is a step of disposing the second protective film 160b on the refraction index matching layer 150. The second protective film 160b may be disposed on the refraction index matching layer 150 by various methods which do not cause the damage of the display panel 130. Referring to FIG. 2E, the second protective film 160b may be slid to be disposed on the refraction index matching layer 150 from the right side portion 112a of the supporting unit 110 which is open but is not limited thereto.

A fourth step is a step of coupling the open right side portion 112a to cover the side surface and the top surface of the second protective film 160b.

Figure 2F:
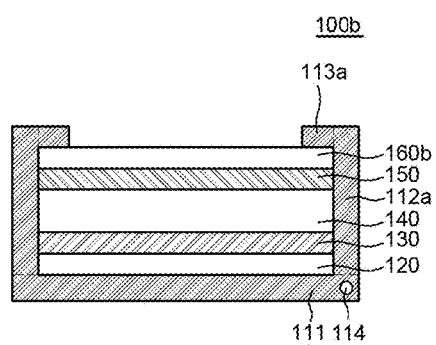

Referring to FIG. 2F, the right side portion 112a open in the second step is coupled to cover the side surface of the second protective film 160b by the connection unit 114 to fix the second protective film 160b onto the display panel 130. By doing this, one side surfaces of the back plate 120, the display panel 130, the cover member 140, the refraction index matching layer 150, and the second protective film 160b are in contact with the inside of the right side portion 112a of the supporting unit 110. Further, a part of a top surface of the second protective film 160b is in contact with a bottom surface of a right protrusion portion 113a.

Further, if necessary, components below the first protective film 160a including the display panel 130 may be separated from the supporting unit 110. The refraction index matching layer 150 includes a non-adhesive material so that if necessary, components below the first protective film including the display panel 130 may also be easily separated.

The exemplary embodiments of the present disclosure can also be described as follows:

According to an aspect of the present disclosure, there is provided a display device. The display device comprises a display panel, a refraction index matching layer disposed on the display panel and including a non-adhesive material, a protective film disposed on the refraction index matching layer, and a supporting unit including a horizontal portion, a side portion vertically bent from the horizontal portion, and a protrusion portion vertically bent from the side portion and disposed on the protective film. Further, the display panel, the refraction index matching layer, and the protective film are seated on the horizontal portion of the supporting unit.

Side surfaces of the display panel, the refraction index matching layer, and the protective film may be in contact with an inner surface of the side portion.

A bottom surface of the protrusion portion may be in contact with the protective film.

A refraction index of the refraction index matching layer may be 1.3 to 1.7.

A loss modulus G" of the refraction index matching layer may be larger than a storage modulus G', at a room temperature.

A loss tangent of the refraction index matching layer may be 1 or larger in the temperature range of −20° C. to 100° C.

The refraction index matching layer may include one or more compounds selected from liquid silicone compounds, liquid acrylic compounds, mineral oils, paraffin oils, naphthenic oils, aromatic oils, process oils, liquid polyalkylene glycols, aliphatic hydrocarbons, alicyclic hydrocarbons, and liquid polybutene.

A surface tension of the refraction index matching layer may be 18 dynes/cm to 34 dynes/cm.

A viscosity of the refraction index matching layer may be 10000 cPs or lower (25° C.)

An adhesiveness of the refraction index matching layer may be 10 gf/in or lower.

A glass transition temperature of the refraction index matching layer may be −30° C. or lower.

A water contact angle of the refraction index matching layer may be 130° or lower.

A thickness of the refraction index matching layer may be 10 μm or larger.

A cover member may be disposed between the display panel and the refraction index matching layer, and a difference between a refraction index of the cover member and a refraction index of the refraction index matching layer may be 0.3 or lower.

The protective film may include one or more selected from polyethylene terephthalate, polyimide, and polymethylmethacrylate.

According to another aspect of the present disclosure, there is provided a method for replacing a first protective film of a display device with a second protective film. In the method, the display device includes a display panel, a refraction index matching layer disposed on the display panel and includes a non-adhesive material, the first protective film disposed on the refraction index matching layer, and a supporting unit including a horizontal portion, a side portion vertically bent from the horizontal portion, and a protrusion portion vertically bent from the side portion and disposed on the first protective film. The method comprises a first step of opening one side surface of the supporting unit to expose at least one side surface of the first protective film, a second step of separating the first protective film from the display panel, a third step of disposing the second protective film on the display panel, and a fourth step of coupling the open one side surface of the supporting unit to cover a side surface and a top surface of the second protective film.

The second step, the first protective film may be separated from the display panel in a sliding manner.

Between the second step and the third step, may further comprise coating a refraction index matching material on the display panel.

It will be apparent to those skilled in the art that various modifications and variations can be made in the display device and the method for replacing a protective film of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
    a display panel;
    a refraction index matching layer disposed on the display panel and including a non-adhesive material;
    a protective film disposed on the refraction index matching layer; and
    a supporting unit including a horizontal portion, a side portion vertically bent from the horizontal portion, and a protrusion portion vertically bent from the side portion and disposed on the protective film,
    wherein the display panel, the refraction index matching layer, and the protective film are seated on the horizontal portion of the supporting unit, and
    wherein the side portion of the supporting unit is configured to be opened for replacement of the protective film.

2. The display device according to claim 1, wherein side surfaces of the display panel, the refraction index matching layer, and the protective film are in contact with an inner surface of the side portion.

3. The display device according to claim 1, wherein a bottom surface of the protrusion portion is in contact with the protective film.

4. The display device according to claim 1, wherein a refraction index of the refraction index matching layer is 1.3 to 1.7.

5. The display device according to claim 1, wherein a loss modulus of the refraction index matching layer is larger than a storage modulus, at a room temperature.

6. The display device according to claim 5, wherein the storage modulus refers to an energy which is stored again by the elasticity when energy is applied to a material, and the loss modulus refers to an energy which is lost due to a viscous property.

7. The display device according to claim 1, wherein a loss tangent of the refraction index matching layer is 1 or larger in the temperature range of −20° C. to 100° C.

8. The display device according to claim 1, wherein the refraction index matching layer includes one or more compounds selected from liquid silicone compounds, liquid acrylic compounds, mineral oils, paraffin oils, naphthenic oils, aromatic oils, process oils, liquid polyalkylene glycols, aliphatic hydrocarbons, alicyclic hydrocarbons, and liquid polybutene.

9. The display device according to claim 1, wherein a surface tension of the refraction index matching layer is 18 dynes/cm to 34 dynes/cm.

10. The display device according to claim 1, wherein a viscosity of the refraction index matching layer is 10000 cPs or lower, at a temperature of 25° C.

11. The display device according to claim 1, wherein an adhesiveness of the refraction index matching layer is 10 gf/in or lower.

12. The display device according to claim 1, wherein a glass transition temperature of the refraction index matching layer is −30° C. or lower.

13. The display device according to claim 1, wherein a water contact angle of the refraction index matching layer is 130° or lower.

14. The display device according to claim 1, wherein a thickness of the refraction index matching layer is 10 μm or larger.

15. The display device according to claim 1, wherein a cover member is disposed between the display panel and the refraction index matching layer, and a difference between a refraction index of the cover member and a refraction index of the refraction index matching layer is 0.3 or lower.

16. The display device according to claim 1, wherein the protective film includes one or more selected from polyethylene terephthalate, polyimide, and polymethylmethacrylate.

\* \* \* \* \*